United States Patent
Kobayashi

(10) Patent No.: US 11,796,400 B2
(45) Date of Patent: Oct. 24, 2023

(54) LIFETIME ESTIMATING SYSTEM AND METHOD FOR HEATING SOURCE, AND INSPECTION APPARATUS

(71) Applicant: TOKYO ELECTRON LIMITED, Tokyo (JP)

(72) Inventor: Masahito Kobayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 325 days.

(21) Appl. No.: 17/172,686

(22) Filed: Feb. 10, 2021

(65) Prior Publication Data

US 2021/0247248 A1 Aug. 12, 2021

(30) Foreign Application Priority Data

Feb. 12, 2020 (JP) ................. 2020-021129

(51) Int. Cl.
*G01K 17/06* (2006.01)
*G01R 31/26* (2020.01)
(Continued)

(52) U.S. Cl.
CPC ............. *G01K 17/06* (2013.01); *G01K 1/026* (2013.01); *G01K 15/007* (2013.01);
(Continued)

(58) Field of Classification Search
CPC ...... G01K 17/06; G01K 1/026; G01K 15/007; G01R 31/2601; G01R 31/2635;
(Continued)

(56) References Cited

U.S. PATENT DOCUMENTS 6,032,724 A * 3/2000 Hatta ................ H01L 21/67103
118/724
6,424,930 B1 * 7/2002 Wood ................. G01R 31/2642
702/182
(Continued)

FOREIGN PATENT DOCUMENTS

JP H10-135315 A 5/1998
JP 2013-011462 A 1/2013
JP 2018-151369 A 9/2018

*Primary Examiner* — Nathaniel T Woodward
*Assistant Examiner* — Philip L Cotey
(74) *Attorney, Agent, or Firm* — Fenwick & West LLP

(57) ABSTRACT

A lifetime estimation system for estimating a lifetime of a heating source is provided in an apparatus for heating a target object using the heating source and performing a feedback control of a target object temperature using a temperature controller based on a temperature measurement value of the target object measured by a temperature measuring device. The temperature controller controls a power supplied to the heating source and performs a temperature control using a state space model to perform the feedback control of the temperature of the target object. The lifetime estimation system includes a temperature monitor unit that monitors the temperature measurement value of the target object, a hunting amount detection unit that detects a hunting amount in a stable region of the monitored temperature of the target object, and a lifetime estimation unit that estimates a lifetime of the heating source from the detected hunting amount.

18 Claims, 11 Drawing Sheets

(51) Int. Cl.
*G01R 31/28* (2006.01)
*G01K 1/02* (2021.01)
*G01K 15/00* (2006.01)
*G01R 31/56* (2020.01)

(52) U.S. Cl.
CPC ...... *G01R 31/2601* (2013.01); *G01R 31/2635* (2013.01); *G01R 31/2642* (2013.01); *G01R 31/2831* (2013.01); *G01R 31/2837* (2013.01); *G01R 31/2849* (2013.01); *G01R 31/2875* (2013.01); *G01R 31/56* (2020.01)

(58) Field of Classification Search
CPC ............ G01R 31/2642; G01R 31/2831; G01R 31/2837; G01R 31/2849; G01R 31/2875; G01R 31/56
See application file for complete search history.

(56) References Cited

U.S. PATENT DOCUMENTS

| | | | |
|---|---|---|---|
| 2008/0205482 A1* | 8/2008 | Cao | G01R 31/2635 374/178 |
| 2014/0072015 A1* | 3/2014 | Han | G05D 23/1919 374/179 |
| 2014/0379298 A1* | 12/2014 | Gilbert | G01K 17/06 702/182 |
| 2015/0309482 A1* | 10/2015 | Iwami | G05B 13/024 700/37 |
| 2016/0103171 A1* | 4/2016 | Tsutsui | G09G 3/006 257/40 |
| 2019/0285689 A1* | 9/2019 | Degrenne | G01K 1/14 |
| 2019/0377023 A1* | 12/2019 | Yao | G01K 7/427 |
| 2022/0011169 A1* | 1/2022 | Ganachari | G05B 15/02 |

* cited by examiner

LIFETIME ESTIMATING SYSTEM AND METHOD FOR HEATING SOURCE, AND INSPECTION APPARATUS

CROSS-REFERENCE TO RELATED APPLICATION

This application claims priority to Japanese Patent Application No. 2020-021129, filed on Feb. 12, 2020, the entire contents of which are incorporated herein by reference.

TECHNICAL FIELD

The present disclosure relates to a lifetime estimating system and method for a heating source, and an inspection apparatus.

BACKGROUND

In a semiconductor manufacturing process, a multiple number of electronic devices having a predetermined circuit pattern are formed on a semiconductor wafer (hereinafter, simply referred to as "wafer"). Inspection of electrical characteristics is performed on these electronic devices and the electronic devices are classified into defective products or non-defective products.

Japanese Patent Application Publication No. H10-135315 discloses an inspection apparatus for performing inspection of electrical characteristics on electronic devices on a wafer before the electronic devices are individually cut out from the wafer. The inspection apparatus includes a probe card having a multiple number of pin-shaped probes, a substrate support for placing thereon a wafer, and a tester. In the inspection apparatus, each probe of the probe card comes into contact with an electrode pad or a solder bump installed correspondingly to an electrode of the electronic device formed on the wafer. Then, an electric signal is transmitted from the electronic device to the tester to inspect the electrical characteristics of the electronic device. Further, the inspection apparatus disclosed in Japanese Patent Application Publication No. H10-135315 includes a temperature controller for controlling the temperature of the substrate support using a cooling mechanism or a heating mechanism in order to emulate an implementation environment of the electronic device during the inspection of the electrical characteristics of the electronic device. For the heating mechanism used in such an inspection apparatus, Japanese Patent Application Publication No. 2018-151369 discloses the use of light emitting diodes (LEDs).

Since the LEDs have a relatively short life expectancy, it is required to predict or estimate the lifetime of the LED. Japanese Patent Application Publication No. 2013-11462 discloses a method for predicting the lifetime of the LEDs. Specifically, LEDs to be tested are disposed in a chamber of a highly accelerated lifetime test apparatus, and the lifetime of the LEDs is estimated using a theoretical model from measured values of light receiving currents from the LEDs.

SUMMARY

In view of the above, the present disclosure provides a lifetime estimating system and method for a heating source, and an inspection apparatus. The lifetime estimating system and method are provided to easily estimate a lifetime of the heating source in the inspection apparatus for heating a target object using the heating source and performing a feedback control of the temperature of the target object using a temperature controller based on the temperature measurement value of the target object.

In accordance with an aspect of the present disclosure, there is provided a lifetime estimation system for estimating a lifetime of a heating source in an apparatus for heating a target object using the heating source and performing a feedback control of a temperature of the target object using a temperature controller based on a temperature measurement value of the target object that is measured by a temperature measuring device, the temperature controller controlling a power supplied to the heating source and performing a temperature control using a state space model to perform the feedback control of the temperature of the target object, the lifetime estimation system including: a temperature monitor unit configured to monitor the temperature measurement value of the target object that is measured by the temperature measuring device; a hunting amount detection unit configured to detect a hunting amount in a stable region of the monitored temperature of the target object monitored by the temperature monitor unit; and a lifetime estimation unit configured to estimate a lifetime of the heating source from the hunting amount detected by the hunting amount detection unit.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of the present disclosure will be described in detail with reference to the accompanying drawings.

<Inspection Apparatus>

First, an inspection apparatus according to an embodiment will be described.

Figure 1:
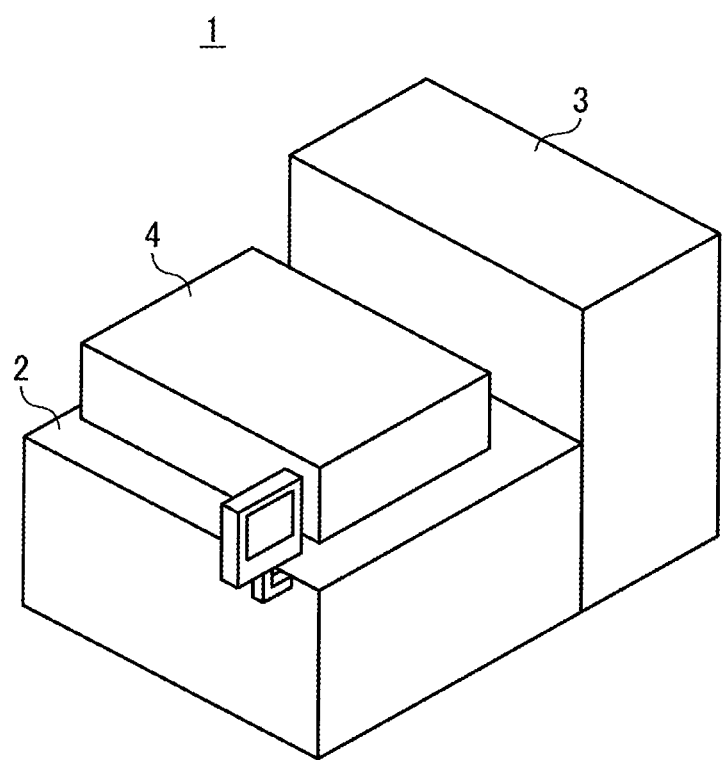
FIG. 1 is a perspective view showing a schematic configuration of an inspection apparatus according to an embodiment.
Figure 2:
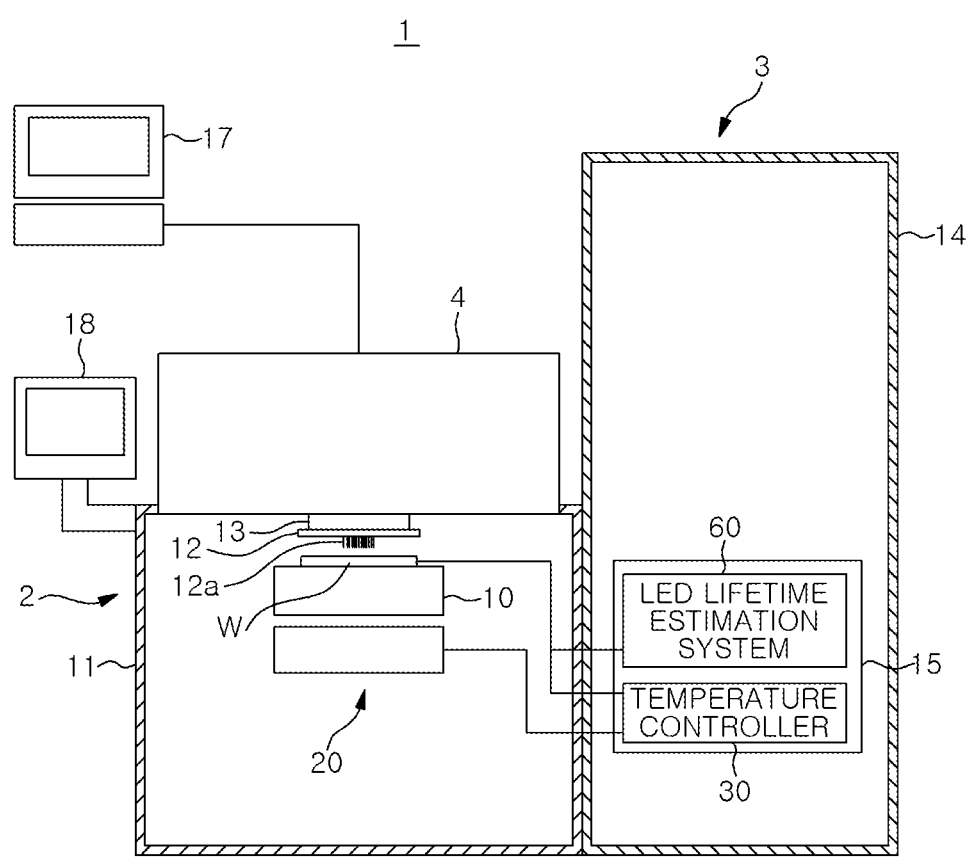
FIG. 2 is a vertical cross-sectional view showing a part of the inspection apparatus of FIG. 1.

FIG. 1 is a perspective view showing a schematic configuration of an inspection apparatus according to an embodiment. FIG. 2 is a vertical cross sectional view showing a part of the inspection apparatus of FIG. 1.

As shown in FIGS. 1 and 2, an inspection apparatus 1 is configured to inspect electrical characteristics of each of multiple electronic devices formed on a wafer W serving as a substrate. The inspection apparatus 1 includes an inspection unit 2, a loader 3, and a tester 4.

The inspection unit 2 includes a hollow housing 11. The housing 11 includes therein a stage 10 on which an inspection target wafer W is attracted and held. Further, the stage 10 is configured to be movable in a horizontal direction and a vertical direction by a moving mechanism (not shown). The inspection unit 2 further includes LEDs as a heating source, a temperature control device 20 configured to control the temperature of the stage, and an LED lifetime estimation system 60 configured to detect the lifetime of the LEDs serving as the heating source. The temperature control device 20 and the LED lifetime estimation system 60 will be described in detail later.

A probe card 12 is disposed above the stage 10 in the inspection unit 2 to be opposed to the stage 10. The probe card 12 has a multiple number of probes 12a that are contact members. Further, the probe card 12 is connected to the tester 4 through an interface 13. When each probe 12a comes into contact with an electrode of each electronic device of the wafer W, the probe 12a supplies the electric power from the tester 4 to the electronic device through the interface 13 or transmits a signal from the electronic device to the tester 4 through the interface 13. Therefore, the interface 13 and the probes 12a function as a supply member for supplying the electric power to the electronic devices.

The loader 3 includes a housing 14. In the housing 14, a FOUP (not shown) that is a transfer container in which the wafer W is accommodated is disposed. Further, the loader 3 has a transfer device (not shown). The transfer device extracts the wafer W accommodated in the FOUP and transfers the wafer W onto the stage 10 of the inspection unit 2. Further, the transfer device transfers the inspected wafer W of which electrical characteristics are inspected from the stage 10 and accommodates the inspected wafer W in the FOUP.

In the housing of the loader 4, a control unit 15 is disposed to perform various controls such as the temperature control of the inspection target electronic device. The control unit 15 may be a computer, and includes a temperature controller 30 included in the temperature control device 20 and an LED lifetime estimation system 60. The control unit 15 further includes a main controller. The main controller includes another controller that is configured to control the temperature controller 30, the LED lifetime estimation system 60, and the individual components of the inspection apparatus 1. Further, the control unit 15 includes, in addition to the main controller, an input device, an output device, a display device, and a storage device. The main controller controls the individual components based on a processing recipe that is a control program stored in a storage medium (a hard disk, an optical desk, a semiconductor memory, or the like) built in the storage device.

Alternatively, the control unit 15 may be disposed in the housing 11 of the inspection unit 2.

At the housing 11 of the inspection unit 2, a user interface unit 18 constituting a part of the control unit 15 is disposed.

The user interface unit 18 is configured to display various pieces of information for a user or allows the user to input instructions. The user interface 18 includes an input unit such as a touch panel or a keyboard and a display unit such as a liquid crystal display.

The tester 4 includes a test board (not shown) that emulates a part of a circuit configuration of a motherboard on which the electronic devices are mounted. The test board is connected to a tester computer 17 that is configured to determine whether the electronic devices are defective or non-defective based on the signals from the electronic devices. In the tester 4, it is possible to emulate the circuit configurations of various types of motherboards by replacing the test board.

The probe card 12, the interface 13, and the tester 4 constitute an inspection mechanism.

When the inspection of the electrical characteristics of the electronic device is performed, the tester computer 17 transmits data to the test board connected to the electronic device through each probe 12a. Then, the tester computer 17 determines whether the transmitted data has been correctly processed by the test board based on the electric signal from the test board.

Figure 3:
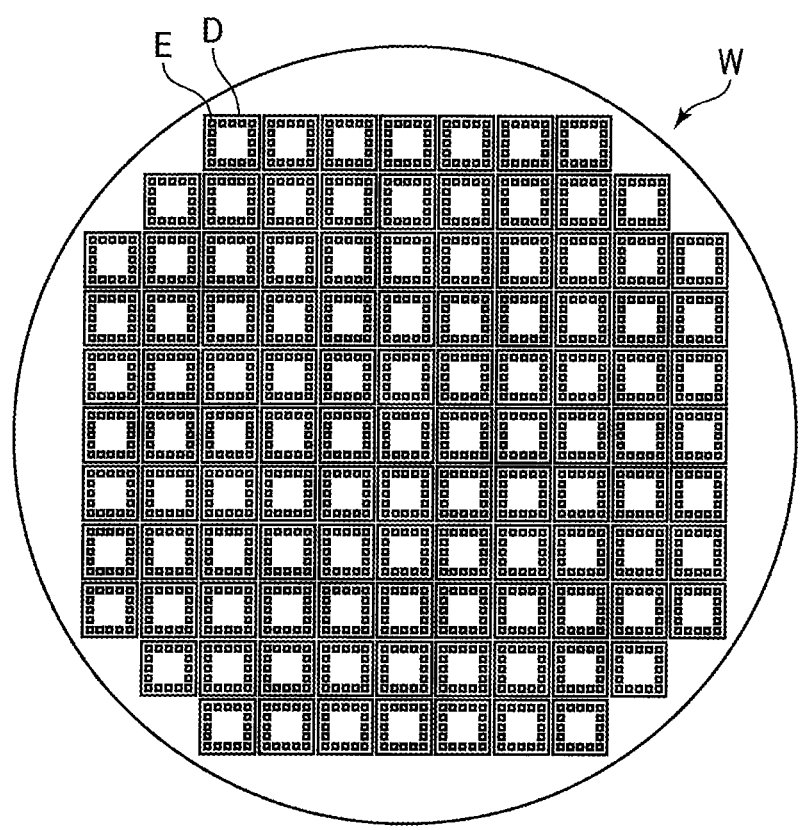
FIG. 3 is a plan view schematically showing a configuration of a wafer that is an inspection target substrate.

As shown in FIG. 3, the wafer W that is an inspection target substrate is formed of a substantially disc-shaped silicon substrate, and a multiple number of electronic devices D are formed at predetermined intervals on a surface of the silicon substrate through etching and wiring processes. Electrodes E are formed on a surface of each electronic device D, and the electrodes E are electrically connected to a circuit element in the electronic device D. A current is supplied to the circuit element in the electronic device D by applying a voltage to the electrodes E.

<Temperature Control Device>

Figure 4:
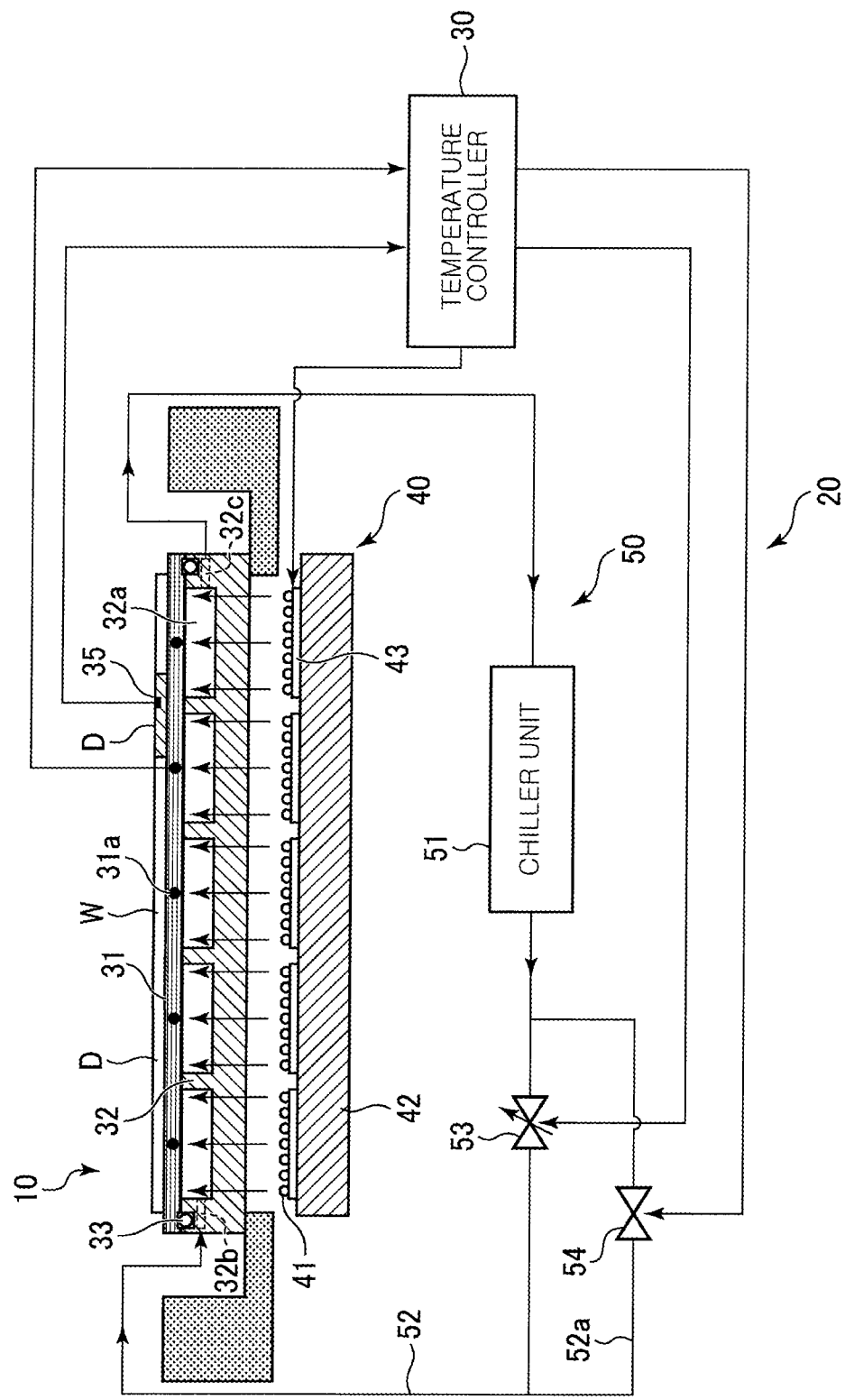
FIG. 4 is a cross-sectional view schematically showing a configuration of an upper portion of a stage and a temperature control device.

Next, a configuration of the temperature control device 20 will be described with reference to FIG. 4. FIG. 4 is a cross-sectional view schematically showing a configuration of an upper portion of the stage 10 and the temperature control device 20. In FIG. 4, a state in which the inspection is performed is illustrated.

As shown in FIG. 4, the stage 10 includes a base member 32 and a lid member 31. The lid member 31 is installed on the base member 32 through a seal ring 33. The wafer W is attracted and held on the lid member 31.

The lid member 31 has a disc shape and is made of, for example, SiC. SiC has high thermal conductivity and a high Young's modulus. Further, the lid member 31 has high absorption efficiency for light from an LED 41 of a heating mechanism 40 to be described later, and thus can be efficiently heated by the light from the heating mechanism 40.

An attraction hole (not shown) for attracting the wafer W is formed on an upper surface of the lid member 31. Further, a multiple number of temperature sensors 31a are installed in the lid member 31 while being spaced apart from each other in plan view. A thermocouple is generally used as the temperature sensors. The temperature sensors 31a are used for controlling the temperature of the stage 10 in a state when the electronic devices D are not inspected.

The base member 32 has a disc shape having substantially the same diameter as that of the lid member 31, and is made of a material that is transparent to light of a specific wavelength from the LED to be described later. An upper portion of the base member 32 has a groove through which a coolant flows. The groove is covered by the lid member 31 to form a coolant channel 32a. In other words, the stage 10 has the coolant channel 32a therein.

The temperature control device 20 includes the heating mechanism 40, a cooling mechanism 50, and the temperature controller 30. The temperature control device 20 controls the temperature of the electronic device D formed on the wafer W on the stage 10, to be maintained at a target temperature by controlling the heating using the heating mechanism 40, the cooling using the cooling mechanism 50, and the heating/cooling using the temperature controller 30. The temperature control using the temperature controller 30 can be performed based on a measurement value from a temperature measuring device 35, e.g., a temperature measuring circuit such as a PN junction, a ring oscillator, or the like, that is installed in each electronic device D and measures the temperature of each electronic device D. The temperature measuring device 35 is not limited thereto as long as the temperature can be measured with good responsiveness.

The heating mechanism 40 is configured as a light irradiation mechanism that irradiates light to the lid member 31 of the stage 10 to heat the lid member 31, so that the wafer W is heated and the electronic device D formed on the wafer W is heated.

Figure 5:
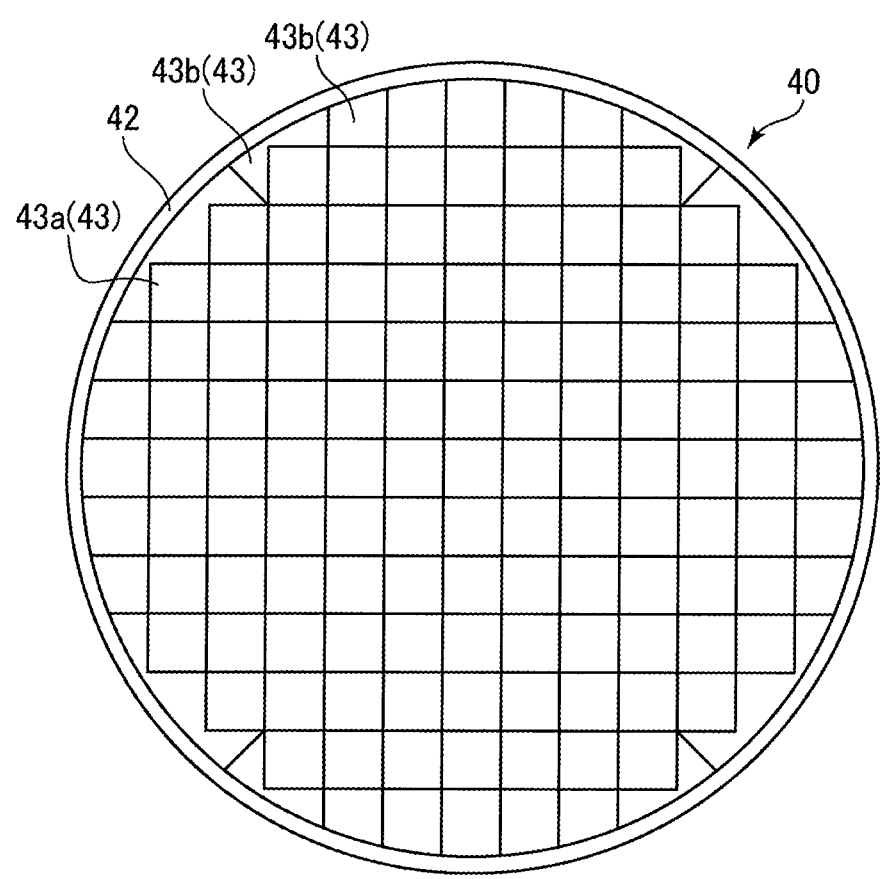
FIG. 5 is a cross-sectional view schematically showing a configuration of a heating mechanism.

The heating mechanism 40 is disposed to face a surface of the stage 10 that is opposite to a surface of the stage 10 on which the wafer W is placed, i.e., a bottom surface of the base member 32. The heating mechanism 40 has a plurality of LEDs 41 for emitting light toward the wafer W as heating sources. Specifically, the heating mechanism 40 has a configuration in which a multiple number of LED units 43, each including a plurality of LEDs 41, are mounted on a surface of a base 42. As shown in FIG. 5, for example, the LED units 43 in the heating mechanism 40 include units 43a, each of which has a square shape in plan view, and units 43b, each of which has a non-square shape in plan view. The square-shaped units 43a are disposed correspondingly to the electronic devices D (see FIG. 3) and the non-square units 43b are disposed at an outer peripheral portion of the LED units 43. The units 43a and 43b cover substantially the entire surface of the base 42, and the light can be emitted from the LEDs 41 of the respective LED units 43 to at least the entire portion of the lid member 31 where the wafer W is placed.

Each of the LEDs 41 emits, for example, near-infrared light. The light emitted from the LEDs 41 (hereinafter, also referred to as "LED light") passes through the base member 32, which is a light transmitting member, of the stage 10. The coolant flowing through the coolant channel 32a is made of a material that can transmit the light from the LEDs 41. The light that has transmitted through the base member 32 passes through the coolant flowing through the coolant channel 32a and is incident on the lid member 31. When the light from the LEDs 41 is near-infrared light, the light transmitting member forming the base member 32 may be made of polycarbonate, quartz, polyvinyl chloride, acrylic resin, or glass. These materials are easily processed and molded.

In the heating mechanism 40, the irradiation and non-irradiation of the LED light incident on the lid member 31 of the stage 10, on which the wafer W is placed, is controlled for each of the LED units 43. Therefore, the heating mechanism 40 can irradiate the LED light to an arbitrary (desired) location on the lid member 31, or can allow the intensity of the light irradiated to the arbitrary location to be different from those of the light irradiated to the other locations.

The cooling mechanism 50 includes a chiller unit 51, a coolant line 52, a variable flow rate valve 53, and a high-speed valve 54. The chiller unit 51 stores the coolant and controls the temperature of the coolant to a predetermined temperature. As an example of a coolant, water, which is a liquid capable of transmitting the light emitted from the LEDs 41, is used. The coolant line 52 is connected to a supply port 32b and a discharge port 32c disposed at a side portion of the base member 32, and is also connected to the chiller unit 51. The coolant in the chiller unit 51 is supplied to the coolant channel 32a through the coolant line 52 by a pump (not shown) disposed in the coolant line 52 and circulated therethrough. The variable flow rate valve 53 is disposed on a downstream side of the chiller unit 51 in the coolant line 52, and the high-speed valve 54 is disposed in a bypass line 52a for bypassing the variable flow rate valve 53 on the downstream side of the chiller unit 51. The variable flow rate valve 53 can set a flow rate and is configured to supply the coolant at the set flow rate. Further, the high-speed valve 54 is opened and closed (on/off) at a high speed so as to start and stop the supply of the coolant flowing through the bypass line 52a at a high speed.

The stage 10, the heating mechanism 40, and the cooling mechanism 50 serve as a heating system including the LEDs 41.

<Temperature Controller>

Next, the temperature controller 30 will be described in detail.

The temperature controller 30 is configured to receive the temperature measurement signal from the temperature measuring device 35, for example, a temperature measuring circuit such as a PN junction or a ring oscillator that is installed in each electronic device D, during the inspection of the electronic device D, and perform the temperature control based on the measurement signal. The temperature controller 30 controls an opening degree of the variable flow valve 53 to set a flow rate of the coolant to be supplied. Further, the temperature controller 30 controls the output of the LEDs 41, as will be described later, and also controls the opening/closing of the high-speed valve 54.

Figure 6:
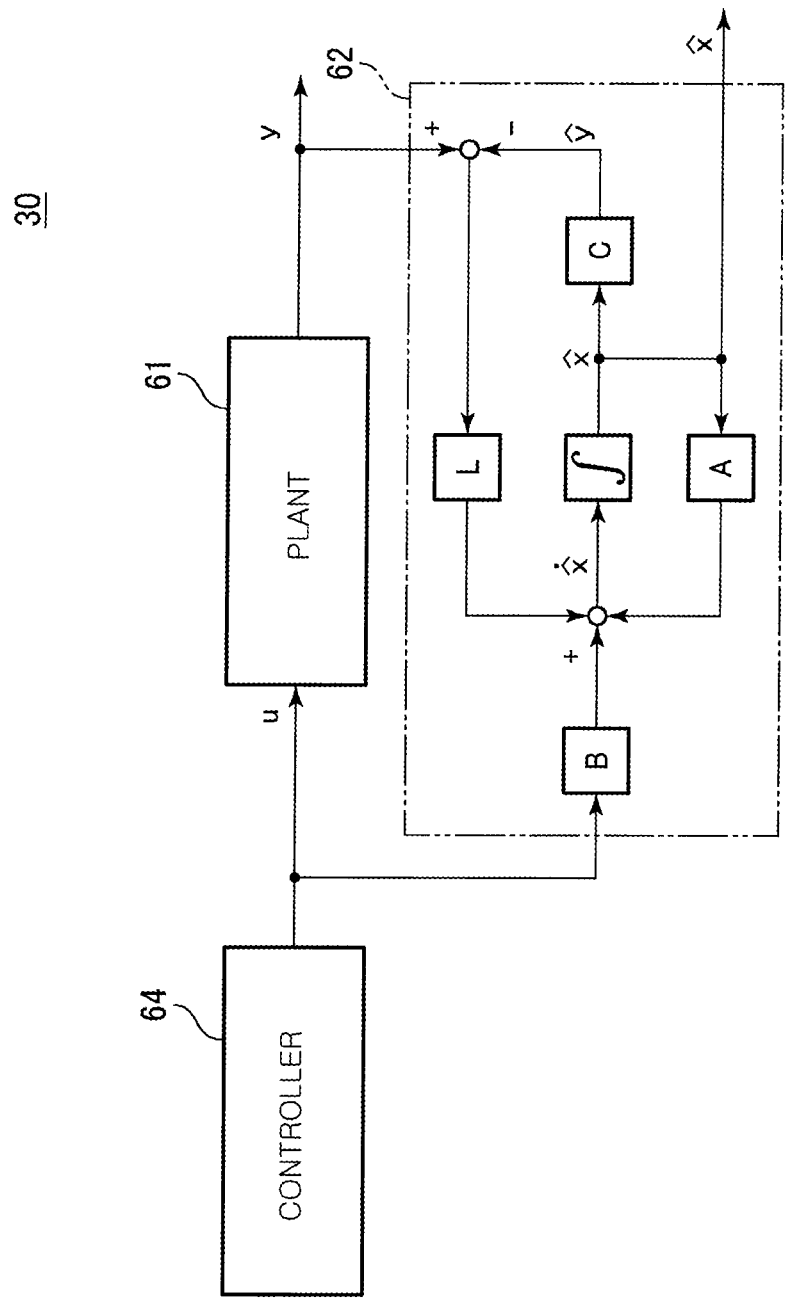
FIG. 6 shows an example of a configuration of a temperature controller.

For the temperature control at this time, a control signal including a power signal is inputted from a controller 64 to the heating system including the LEDs 41, and a temperature is outputted. At this time, system identification is performed, and a transfer function is created by formulating the heating system including the LEDs 41 to a thermal circuit model to perform the temperature control using a state space model. For example, as shown in FIG. 6, the heating system including the LEDs 41 is set as a plant 61, an observer 62 that modeled from the plant 61 is provided under the plant 61, and the difference between the observer 62 and the plant 61 is fed back to the plant 61. In FIG. 6, 'u' indicates an input power and 'y' indicates an output temperature.

The observer 62 uses 'u' and 'y' to estimate an internal state that cannot be measured. Although the observer 62 basically has the same configuration as that of the plant 61, it is different from the plant 61 in that an observer gain L is added. The observer gain L is determined by specifying the pole of the observer or the like. System matrices A, B, and C are pre-identified.

On the assumption that the following equation (1) indicates the state equation and the output equation of the plant and the following equation (2) indicates the state equation and the output equation of the observer, the following equation (3) is satisfied.

< Formula 1 >

$$\dot{x} = Ax + Bu \qquad y = Cx \qquad (1)$$

$$\dot{\hat{x}} = A\hat{x} + Bu \qquad \hat{y} = Cx \qquad (2)$$

$$\dot{\hat{x}} = A\hat{x} + Bu - LC(\hat{x} - x) \qquad (3)$$

In other words, as shown in the equation (3), the difference between the observer 62 and the actual plant 61 exists as a correction term. Thus, the difference is fed back to the plant 61 so as to correct the plant 61, thereby performing the optimal feedback control.

Further, the controller 64 outputs a control signal including a power signal to the plant 61 and the observer 62 so that the control temperature reaches a desired temperature based on the temperature measurement value of the electronic device D. The controller 64 may be a control system including a sliding mode control.

Figure 7:
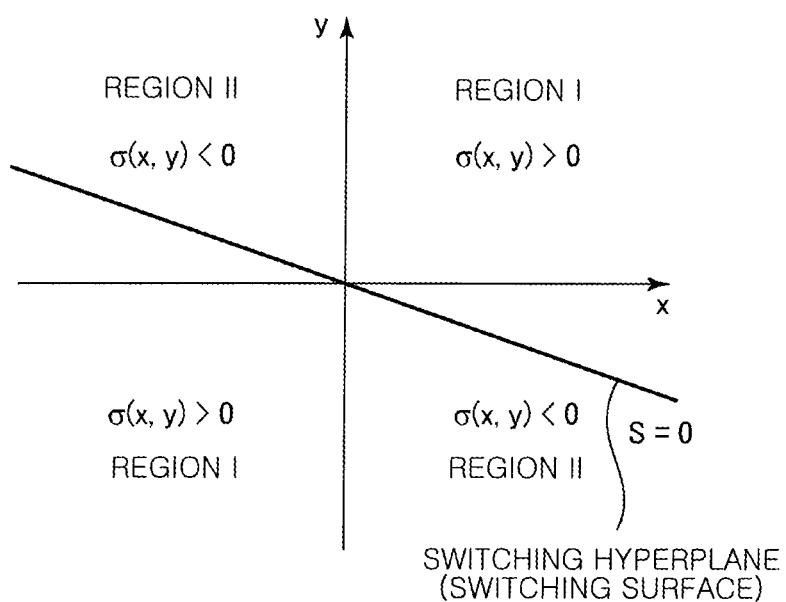
FIG. 7 explains a sliding mode control.

The sliding mode control is a control method for switching the control of the control target to above and below the switching hyperplane to converge the state of the control target onto a preset switching hyperplane (switching surface) in the state space. When the initial state of the control target is outside the switching hyperplane, the state of the control target is directed to reach and be converged onto the switching hyperplane within a finite time (reaching mode). When the state of the control target reaches the switching hyperplane, the state is converged toward a target value while sliding in the switching hyperplane (sliding mode). The control input u of the sliding mode control is the sum of a linear term (linear control operation amount) $u_1$ and a nonlinear term (nonlinear control operation amount) $u_{n1}$, and may be expressed by the following equation:

$$U = -(SB)^{-1}SAx - K(SB)^{-1} \cdot sgn(\sigma) = -(SB)^{-1}\{SAx + K \cdot sgn(\sigma)\}$$

$$\sigma = Sx$$

where SAx is a linear term, and K·sgn(σ) is a nonlinear term, A and B are matrices of a state equation, and S and K are control parameters. The function sgn represents a discontinuous function, and sgn(σ) is a switching function of the sliding mode. The switching hyperplane may be designed with a framework of linear control, and in the sliding mode, the control proceeds on the switching hyperplane by the nonlinear term while moving back and forth between the region II and the region I, shown in FIG. 7, in a very short period of time. In other words, in the sliding mode, the linear term (linear control operation amount) allows the state of the control system on the switching hyperplane to have minimum control error, and the nonlinear term (nonlinear control operation amount) allows the state of the control system to direct toward the switching hyperplane if there is a modeling error or an uncertain disturbance. Accordingly, the temperature control can be performed with extremely high accuracy. Although x and y are used to display the coordinates in FIG. 7, they are irrelevant to x and y in FIGS. 6, 8 and 9.

When the controller 64 includes the sliding mode control, the controller 64 may include the sliding mode controller alone, or may include a combination of the sliding mode controller and a cooling mode controller.

In the case of controlling the sliding mode controller alone, the sliding mode control with a constant flow rate of the coolant from the cooling mechanism 50 is performed while using the power supplied to the LEDs 41 as an operation amount.

However, when the heat emission disturbance of the electronic devices D is very severe, heat absorption using the sliding mode control is not sufficient, even though the LEDs 41 are turned off. Therefore, either the response to the disturbance control becomes slow, or sufficient temperature control cannot be achieved.

In the above case, it is preferable to perform temperature control by using both the sliding mode control in which the power (current value output) supplied to the LEDs 41 (the heating sources) is used as an operation amount and the cooling mode control in which the power (opening/closing signal of the high-speed valve) supplied to the high-speed valve (the cooling source) is used as an operation amount. Accordingly, heat absorption can be increased compared to the case of merely using the sliding mode control in which the power (current value output) supplied to the LEDs 41 (the heating sources) is the operation amount, making it possible to cope with a very high heat emission disturbance.

Figure 8:
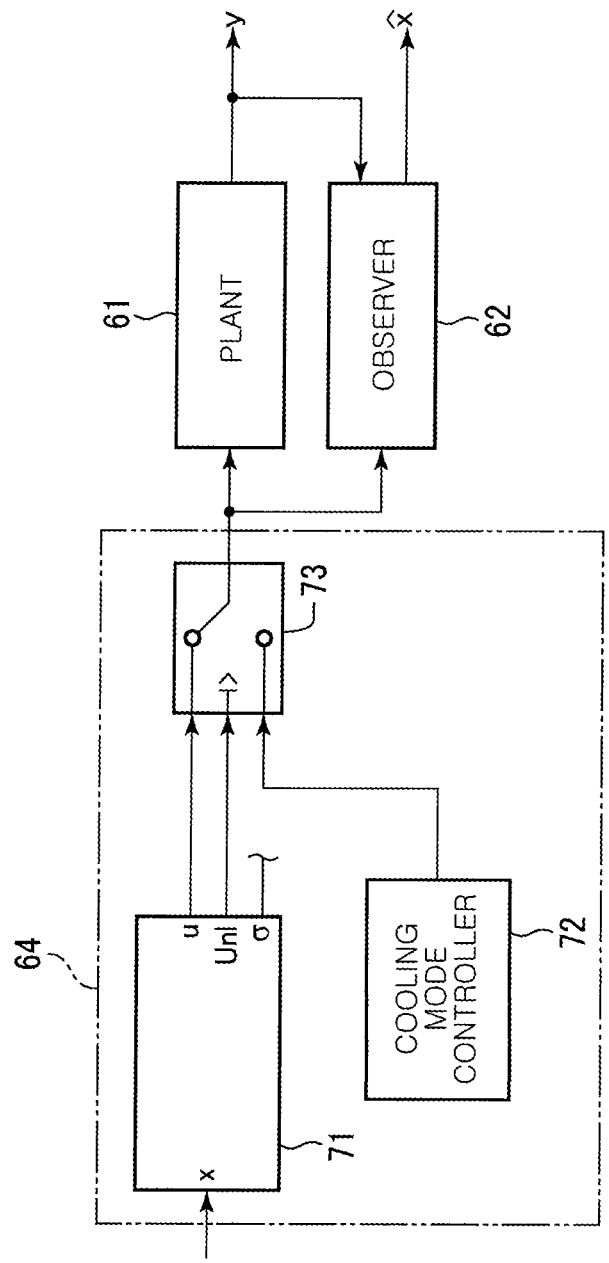
FIG. 8 is a block diagram showing an example of a case where a controller of the temperature controller includes a sliding mode controller and a cooling mode controller.

FIG. 8 is a block diagram showing an example of the case where the controller 64 includes the sliding mode controller and the cooling mode controller. In this example, a sliding mode control system includes a sliding mode controller 71, a cooling mode controller 72, and a switching controller 73.

The sliding mode controller 71 is configured to perform the temperature control by outputting the power (a current value output) supplied to the LEDs 41 of the heating mechanism 40 as an operation amount. In the sliding mode controller 71, the temperature x of each electronic device D measured by the temperature measuring device 35 is inputted and a sliding mode signal u formed by a linear term and a nonlinear term is outputted.

The cooling mode controller 72 is configured to perform a cooling control while using the power (the opening/closing signal of the high-speed valve 54) supplied to the high-speed valve 54 (the cooling source) as an operation amount. Accordingly, the amount of the coolant supplied to the coolant channel 32a of the stage 10 is controlled, and the temperature of the electronic device D is controlled. The output of the cooling mode controller 72 is calculated by a heat absorption model based on the flow rate of the coolant and a heat absorption coefficient.

The switching controller 73 is configured to use the value of the nonlinear term $u_{n1}$ of the sliding mode controller as a switching signal. In other words, based on the value of the nonlinear term $u_{n1}$, the switching controller 73 determines whether to use the output (control input) of the sliding mode controller 71 alone or to use the output of the cooling mode controller 72 as a second operation amount instead of using the output of the sliding mode controller 71.

Using the output (control input) of the sliding mode controller 71 alone for the operation amount indicates that the output of the sliding mode controller 71 is outputted to the LEDs 41 that are the heating sources as a first operation amount.

Using the output of the cooling mode controller 72 for the operation amount indicates that the output of the high-speed valve that is the cooling source of the cooling mode controller 72 is used as the second operation amount.

Specifically, when the value of the nonlinear term $u_{n1}$ is positive (one side of the switching hyperplane; region I in FIG. 7), the switching controller 73 outputs the output of the sliding mode controller 71 to the LEDs 41 as the first operation amount. Further, when the value of the nonlinear term $u_{n1}$ is negative (the other side of the switching hyperplane; region II in FIG. 7), the output (opening/closing signal of the high-speed valve) of the high-speed valve that is the cooling source of the cooling mode controller 72 is used as the second operation amount. The high-speed valve 54 has a high-speed opening/closing time of 0.1 sec or less, and the high-speed valve 54 is opened and closed following the high-speed switching by the nonlinear term $u_{n1}$. In other words, when the nonlinear term $u_{n1}$ of the sliding mode control is a negative value, the nonlinear term $u_{n1}$ is output as the opening/closing signal of the high-speed valve 54, and the sliding mode control of the LEDs 41 is switched to the cooling mode control. By using the cooling mode control, the electronic device D may be further cooled compared to the case when the LEDs 41 are turned off. Accordingly, the temperature controllability of the electronic device D is ensured even when the voltage (power) applied from the tester 4 to the electronic device D is very high and a large amount of heat is emitted from the electronic device D.

Figure 9:
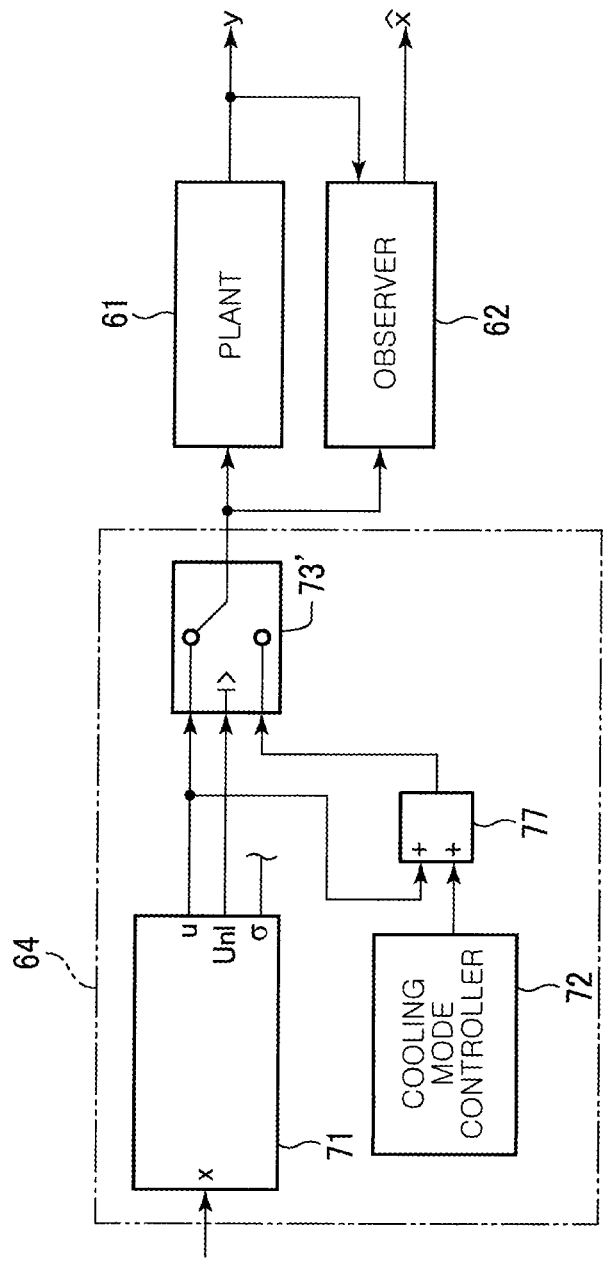
FIG. 9 is a block diagram showing another example of the case where the controller of the temperature controller includes the sliding mode controller and the cooling mode controller.

FIG. 9 is a block diagram showing another example of the case where the controller 64 includes the sliding mode controller and the cooling mode controller. In the example of FIG. 9, the controller 64 includes the sliding mode controller 71, the cooling mode controller 72, a switching controller 73', and an adder 77. The sliding mode controller 71 and the cooling mode controller 72 are configured in the same way as those in the example of FIG. 8. However, the example of FIG. 9 is different from the example of FIG. 8 in that a control signal is transmitted to the LEDs 41 that are the heating sources in the cooling mode control.

Similar to the switching controller 73 of the example shown in FIG. 8, the switching controller 73' is configured to use the value of the nonlinear term $u_{n1}$ of the sliding mode controller as a switching signal. Then, based on the value of the nonlinear term $u_{n1}$, the switching controller 73' determines whether to use the output of the sliding mode controller 71 alone or to use the second operation amount. The switching controller 73' uses, as the second operation amount, the sum of the output of the sliding mode controller 71 and the output of the cooling mode controller 72 that are added by the adder 77. In other words, the second operation amount is the sum of the output from the sliding mode controller 71 to the LEDs 41 that are the heating sources and the output of the high-speed valve that is the cooling source of the cooling mode controller 72.

Specifically, when the value of the nonlinear term $u_{n1}$ is positive (one side of the switching hyperplane; region I in FIG. 7), the switching controller 73' outputs the output of the sliding mode controller 71 to the LEDs 41 as the first operation amount. Further, when the value of the nonlinear term $u_{n1}$ is negative (the other side of the switching hyperplane; region II in FIG. 7), the sum of the output of the sliding mode controller 71 and the output (opening/closing signal of the high-speed valve) of the high-speed valve that is the cooling source of the cooling mode controller 72 is used as the second operation amount.

As described above, in the cooling mode controller 72, the high-speed valve 54 has a high-speed opening/closing time of 0.1 sec or less, and the high-speed valve 54 is opened and closed following the high-speed switching by the nonlinear term $u_{n1}$. Accordingly, the electronic device D may be further cooled compared to the case when the LEDs 41 are turned off, and the temperature controllability of the electronic device D is ensured in the case where a large amount of heat is emitted from the electronic device D. In addition, since the output of the sliding mode controller 71 and the output of the high-speed valve of the cooling mode controller 72 are added together to be used as the second operation amount, the excessive response of rapid cooling can be alleviated and excellent controllability can be obtained.

<LED Lifetime Estimation System>

As described above, the LED lifetime estimation system 60 is included in the control unit 15 and estimates the lifetime of the LEDs 41 using the characteristics of temperature control obtained by the state space model. The lifetime estimation of the LEDs 41 is performed collectively for the plurality of LEDs 41 of the heating mechanism 40.

Figure 10:
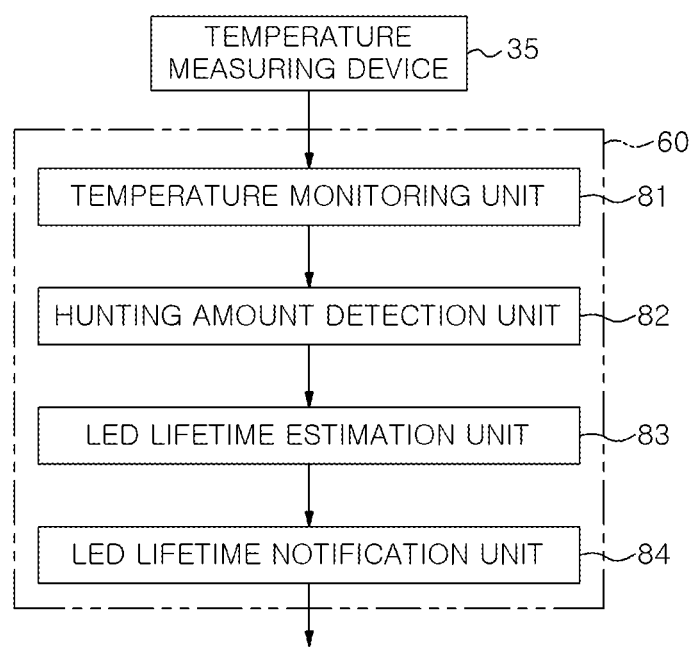
FIG. 10 is a block diagram showing an LED lifetime estimation system.

FIG. 10 is a block diagram showing the LED lifetime estimation system 60. As shown in FIG. 10, the LED lifetime estimation system 60 includes a temperature monitoring unit 81, a hunting amount detection unit 82, an LED lifetime estimation unit 83, and an LED lifetime notification unit 84. The temperature monitoring unit 81 is configured to monitor the measurement value of the temperature measuring device 35 for measuring the temperature of each electronic device D, for example, the measurement value of the temperature measuring circuit installed in each electronic device D. The hunting amount detection unit 82 is configured to receive the temperatures of the electronic devices D monitored by the temperature monitoring unit 81 and detect a hunting amount in a stable region of the monitored temperatures. The LED lifetime estimation unit 83 is configured to estimate the lifetime of the LEDs 41 from the hunting amount detected by the hunting amount detection unit 82. For example, the relationship between the hunting amount and the output of the LEDs is obtained to estimate (predict) the lifetime of the LEDs 41. Further, the threshold of the hunting amount of the LEDs 41 may be set in advance, and the threshold may be used as a reference for estimating the lifetime. For example, when the hunting amount reaches the threshold, the estimated remaining lifetime of the LEDs 41 that was set in advance may be outputted. The LED lifetime notification unit 84 is configured to appropriately notify the estimated lifetime based on the signal from the LED lifetime estimation unit 83. For example, the estimated lifetime of the LEDs 41 is displayed on the display unit.

The following is a description of the principle of the LED lifetime estimation system 60.

In the temperature control using a state space model, system identification is performed and a plant is formulated to a specific model to create a transfer function and estimate an output for a certain input. In this case, for example, the difference between the actual plant and the modeled plant is fed back to the plant so as to correct the plant, thereby realizing the optimal feedback control. For example, as shown in FIG. 6, the heating system including the LEDs 41 is set as the plant 61, and the observer 62 that modeled from the plant 61 (heating system) is provided under the plant 61. The difference between the observer 62 and the actual plant 61 exists as a correction term. Thus, the difference is fed back to the plant 61 so as to correct the plant 61, thereby performing the optimal feedback control.

Figure 11:
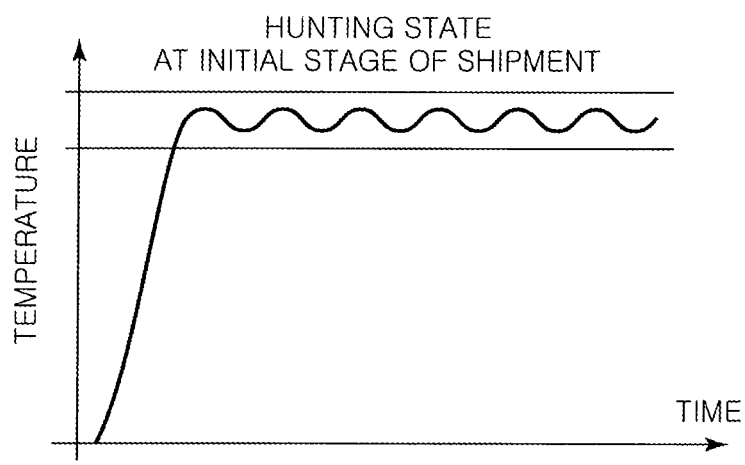
FIG. 11 shows a hunting state in a stable region after step waveform input at an initial stage of shipment in the case of providing an observer that modeled from a plant at an actual plant and performing the optimal feedback control.

By performing the optimal feedback control, at the stage of initial shipment, the hunting amount of the temperature in the stable region after the input of the step waveform is small and stable as shown in FIG. 11.

Figure 12:
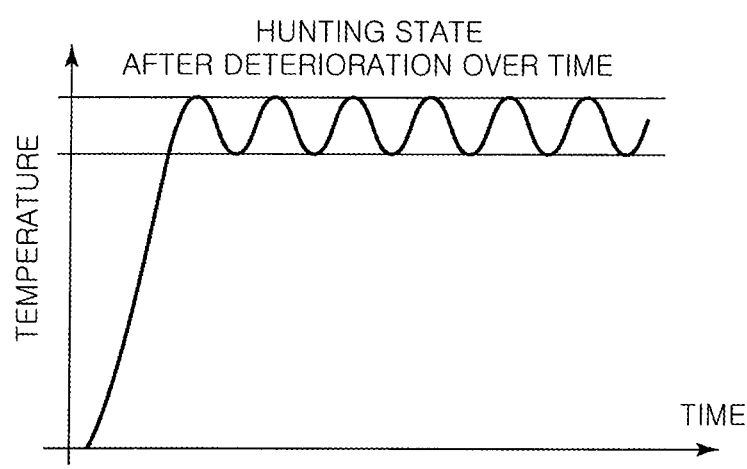
FIG. 12 shows a hunting state in a stable region after step waveform input when an LED has deteriorated over time in the case of providing an observer that modeled from a plant at an actual plant and performing the optimal feedback control.

However, in the actual plant 61, the LEDs 41 deteriorate over time and the output thereof gradually decreases, so that the difference occurs between the observer 62 that is the state space model and the plant 61 over time. If the difference increases due to deterioration over time, it is difficult to reduce the difference even if the optimal feedback control is performed. Accordingly, as shown in FIG. 12, the hunting amount of the temperature in the stable region after the input of the step waveform is large and exceeds the allowable temperature range.

In other words, in the case of controlling the temperature of the heating system including the LEDs 41 by using the state space model, the output decrease caused by the deterioration of the LEDs 41 and the hunting amount of the temperature in the stable region after the input of the step waveform have a strong correlation. The hunting amount increases as the LEDs 41 deteriorate.

Therefore, in the present embodiment, based on such a principle, the LED lifetime estimation system 60 monitors the temperatures of the electronic devices D to obtain the hunting amount of the temperature in the stable region and estimate the lifetime of the LEDs 41 from the hunting amount. Specifically, as described above, the hunting amount detection unit 82 detects the hunting amount based on the temperatures of the electronic devices D monitored by the temperature monitoring unit 81, and the LED lifetime estimation unit 83 predicts (estimates) the lifetime of the LEDs from the hunting amount.

<Inspection Process Performed by Inspection Apparatus>

Next, an example of an inspection process performed on the wafer W by using the inspection apparatus 1 will be described.

First, the wafer W is extracted from the FOUP of the loader 3, transferred to the stage 10, and placed on the stage 10 by a transfer device. Next, the stage 10 is moved to a predetermined position.

Then, all the LEDs 41 of the heating mechanism 40 are turned on, and the light output from the LEDs 41 is adjusted and the flow rate of the coolant flowing through the coolant channel 32a in the stage 10 is adjusted by the variable flow rate valve 53 based on the information acquired from the temperature sensors 31a of the lid member 3 such that the temperature of the lid member 31 has in-plane uniformity.

In this state, the stage 10 is moved to bring the probes 12a disposed above the stage 10 into contact with the electrodes E of the inspection target electronic device D on the wafer W, and the inspection of the electronic device D is started.

During the above inspection, the temperature control device 20 controls the temperature of the electronic device D. In the temperature control device 20, for example, the temperature of the electronic device D is measured by the temperature measuring device 35 that is formed of the temperature measuring circuit installed in the electronic device D, and the temperature controller 30 controls the heating mechanism 40 and the cooling mechanism 50 based on the temperature measurement value, and performs the feedback control of the temperature of the electronic device D. Specifically, the heating system including the LEDs 41 is set as the plant 61, and the observer 62 that modeled from the heating system is provided under the plant 61. Then, the difference between the observer 62 and the plant 61 is fed back to the plant so as to correct the plant 61, and thus the optimal feedback control is performed.

Further, the controller 64 outputs a control signal including a power signal to the plant 61 and the observer 62 so that the temperature outputted from the plant 61 reaches a desired temperature based on the temperature measurement value of the electronic device D. By using the sliding mode control system including the sliding mode control, the controller 64 can realize highly accurate temperature control against modeling errors or uncertain disturbances. In addition, by using both the sliding mode control and the cooling mode control, it is possible to cope with a very high heat emission disturbance caused by a recent increase in the heat emission density of the electronic device.

Since the lifetime of the LEDs used in the heating mechanism 40 is relatively short, it is required to predict or estimate the lifetime of the LEDs due to deterioration over time and determine the replacement timing of the LEDs so that the downtime of the apparatus with the LEDs can be minimized. As an example of a method of predicting the lifetime of the LEDs, Japanese Patent Application Publication No. 2013-11462 discloses a method for predicting the lifetime of LEDs to be tested by disposing the LEDs in a chamber of a highly accelerated lifetime test apparatus provided separately from a LED mounting apparatus and estimating the lifetime of the LEDs from measurement values of light receiving currents from the LEDs using the theoretical model.

However, in such a technique, it is necessary to remove the LEDs from the LED mounting apparatus to perform a lifetime test, which is complicated.

On the other hand, in the present embodiment, the LED lifetime estimation system 60 is provided to estimate the lifetime of the LED 41 using the phenomenon that the hunting amount increases as the LEDs 41 deteriorate in the case of controlling the temperature of the heating system including the LEDs 41 by using the state space model. Specifically, the hunting amount detection unit 82 detects the hunting amount based on the temperatures of the electronic devices D monitored by the temperature monitoring unit 81, and the LED lifetime estimation unit 83 predicts (estimates) the lifetime of the LEDs 41 from the hunting amount. Accordingly, the lifetime of the LEDs can be easily estimated without complicated operations such as estimation of the lifetime of the LEDs using a test apparatus provided separately from the LED mounting apparatus. In addition, since the lifetime of the LEDs 41 can be estimated from the hunting amount obtained from the temperature profile monitored during the actual inspection performed by the inspection apparatus 1, the lifetime of the LEDs 41 can be estimated on-time during the inspection process without an additional checking operation or the like.

<Other Applications>

The presently disclosed embodiments are considered in all respects to be illustrative and not restrictive. The above-described embodiments can be embodied in various forms. Further, the above-described embodiments may be omitted, replaced, or changed in various forms without departing from the scope of the appended claims and the gist thereof.

For example, in the above embodiment, the case where the LEDs are used as the heating sources has been described. However, the heating sources are not limited to the LEDs and may be other heating sources such as a resistance heater(s) and the like. Further, in the above embodiment, the electronic devices (chips) on the wafer are described as an example of the temperature control target. However, the temperature control target is not limited thereto. In addition, although the case where the lifetime estimation system for the heating sources (LEDs) is applied to the inspection apparatus has been described, the present disclosure is not limited thereto.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

What is claimed is:

1. A lifetime estimation system for estimating a lifetime of a heating source in an apparatus for heating a target object using the heating source and performing a feedback control of a temperature of the target object using a temperature controller based on a temperature measurement value of the target object that is measured by a temperature measuring device, the temperature controller controlling a power supplied to the heating source and performing a temperature control using a state space model to perform the feedback control of the temperature of the target object, the lifetime estimation system comprising:
a processor; and
a memory storing instructions thereon, the instructions when executed by the processor cause the processor to:
monitor the temperature measurement value of the target object that is measured by the temperature measuring device;
detect a hunting amount in a stable region of the monitored temperature of the target object; and
estimate the lifetime of the heating source from the detected hunting amount.

2. The lifetime estimation system of claim 1, wherein the instructions when executed by the processor further cause the processor to obtain a relationship between the hunting amount and an output of the heating source and estimate the lifetime of the heating source from the relationship.

3. The lifetime estimation system of claim 1, wherein the instructions when executed by the processor further cause the processor to preset a threshold for the hunting amount of the heating source and use the threshold as a reference for estimating the lifetime of the heating source.

4. The lifetime estimation system of claim 1, wherein the heating source is an LED.

5. A lifetime estimation method for estimating a lifetime of a heating source in an apparatus for heating a target object using the heating source and performing a feedback control of a temperature of the target object using a temperature controller based on a temperature measurement value of the target that is measured by a temperature measuring device, the temperature controller controlling a power supplied to the heating source and performing temperature control using a state space model to perform the feedback control of the temperature of the target object, the lifetime estimation method comprising:
monitoring the temperature measurement value of the target object that is measured by the temperature measuring device;
detecting a hunting amount in a stable region of the monitored temperature of the target object, and
estimating the lifetime of the heating source from the detected hunting amount.

6. The lifetime estimation method of claim 5, wherein a relationship between the hunting amount and an output of the heating source is obtained, and the lifetime of the heating source is estimated from the relationship.

7. The lifetime estimation method of claim 5, wherein a threshold for the hunting amount of the heating source is set in advance, and the threshold is used as a reference for estimating the lifetime of the heating source.

8. The lifetime estimation method of claim 5, wherein the heating source is an LED.

9. The lifetime estimation method of claim 5, wherein the temperature controller includes a heating system including the heating source that is set as a plant, and an observer that modeled from the plant, and the temperature controller performs the feedback control with a difference between the plant and the observer.

10. An inspection apparatus comprising:
a stage on which a substrate having multiple electronic devices is placed;
an inspection mechanism configured to inspect the electronic devices by bringing probes into electrical contact with the electronic devices formed on the substrate on the stage;
a heating mechanism having a heating source for heating the electronic devices;
a cooling mechanism having a cooling source for cooling the electronic devices;
temperature measuring devices configured to respectively measure temperatures of the electronic devices;
a temperature controller configured to control a power supplied to the heating source and perform temperature control using a state space model to perform a feedback control of the temperature of each of the electronic devices based on temperature measurement values measured by the temperature measuring devices; and
a lifetime estimation system configured to estimate a lifetime of the heating source,
wherein the lifetime estimation system includes:
a processor; and
a memory storing instructions thereon, the instructions when executed by the processor cause the processor to:
monitor the temperature measurement values of the electronic devices measured by the temperature measuring devices;
detect a hunting amount in a stable region of the monitored temperatures of the electronic devices; and
estimate the lifetime of the heating source from the detected hunting amount.

11. The inspection apparatus of claim 10, wherein the instructions when executed by the processor further cause the processor to obtain a relationship between the hunting amount and an output of the heating source, and estimate the lifetime of the heating source from the relationship.

12. The inspection apparatus of claim 10, wherein the instructions when executed by the processor further cause the processor to preset a threshold for the hunting amount of the heating source and use the threshold as a reference for estimating the lifetime of the heating source.

13. The inspection apparatus of claim 10, wherein the heating source is an LED.

14. The inspection apparatus of claim 10, wherein each of the temperature measuring devices is a temperature measuring circuit installed in each of the electronic devices.

15. The inspection apparatus of claim 10, wherein the temperature controller includes a heating system including the stage, the heating mechanism, and the cooling mechanism that is set as a plant and an observer that modeled from the plant, and the temperature controller performs the feedback control with a difference between the plant and the observer.

16. The inspection apparatus of claim 15, wherein the temperature controller further includes:
a controller configured to perform a control including a sliding mode control that outputs a control signal including a power signal to the plant and the observer based on the temperature measurement values of the electronic devices.

17. The inspection apparatus of claim 16, wherein the controller includes: a sliding mode controller using a power supplied to the heating source as an operation amount; a cooling mode controller using a power supplied to the cooling source as an operation amount; and a switching controller configured to determine whether to output an output of the sliding mode controller alone as a first operation amount to the heating source or to use an output of the cooling mode controller as a second operation amount, based on a value of a nonlinear term between a linear term and the nonlinear term that are the output of the sliding mode controller.

18. The inspection apparatus of claim 17, wherein the second operation amount is only the output of the cooling mode controller or a sum of the output of the sliding mode controller and the output of the cooling mode controller.

* * * * *